United States Patent
Samelis

(10) Patent No.: US 9,537,452 B2
(45) Date of Patent: Jan. 3, 2017

(54) BROADBAND POWER AMPLIFIER SYSTEMS AND METHODS

(71) Applicant: Skyworks Solutions, Inc., Woburn, MA (US)

(72) Inventor: Apostolos Samelis, Bishop's Stortford (GB)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/664,521

(22) Filed: Mar. 20, 2015

(65) Prior Publication Data

US 2015/0311874 A1   Oct. 29, 2015

Related U.S. Application Data

(60) Provisional application No. 61/985,930, filed on Apr. 29, 2014.

(51) Int. Cl.
*H01Q 11/12* (2006.01)
*H03F 1/02* (2006.01)
*H03F 1/48* (2006.01)
*H03F 1/56* (2006.01)
*H03F 3/195* (2006.01)
(Continued)

(52) U.S. Cl.
CPC .......... *H03F 1/0261* (2013.01); *H03F 1/0277* (2013.01); *H03F 1/486* (2013.01);
(Continued)

(58) Field of Classification Search
CPC ............ H03F 2200/318; H03F 2200/36; H03F 2200/391; H03F 2200/402; H03F 2200/411; H03F 2200/414; H03F 2200/421; H03F 2200/516; H03F 2203/7236
(Continued)

(56) References Cited

U.S. PATENT DOCUMENTS 5,969,582 A * 10/1999 Boesch ...................... H03F 1/56
                                                            333/129
8,461,931 B1 * 6/2013 Bayruns ................ H03F 1/0244
                                                            330/127

(Continued)

OTHER PUBLICATIONS

PCT International Search Report for Application No. PCT/US2015/025580 dated Apr. 13, 2015, 3 pages.

(Continued)

*Primary Examiner* — Edward Urban
*Assistant Examiner* — Max Mathew
(74) *Attorney, Agent, or Firm* — Knobbe, Martens, Olson & Bear, LLP

(57) ABSTRACT

Disclosed are systems, devices, and methodologies to reduce harmonics in a radio frequency output signal. A power amplifier system comprises a power amplifier and a tunable output matching network electrically connected between the output of the power amplifier and an output of the tunable output matching network. The tunable output matching network reduces second-order harmonics in an amplified radio frequency signal when the power amplifier operates in a low frequency mode. The tunable output matching network includes traps such as a series inductor and a first capacitor in series with a first switch, a second capacitor in series with a second switch, and a third capacitor in series with a third switch, where the traps are tuned to selected harmonic frequencies when the power amplifier operates in the low frequency band of the operating band of frequencies.

20 Claims, 15 Drawing Sheets

(51) Int. Cl.
    *H03F 3/24*         (2006.01)
    *H03F 3/72*         (2006.01)

(52) U.S. Cl.
    CPC .............. *H03F 1/565* (2013.01); *H03F 3/195* (2013.01); *H03F 3/245* (2013.01); *H03F 3/72* (2013.01); *H03F 2200/108* (2013.01); *H03F 2200/111* (2013.01); *H03F 2200/222* (2013.01); *H03F 2200/318* (2013.01); *H03F 2200/36* (2013.01); *H03F 2200/387* (2013.01); *H03F 2200/391* (2013.01); *H03F 2200/402* (2013.01); *H03F 2200/411* (2013.01); *H03F 2200/414* (2013.01); *H03F 2200/421* (2013.01); *H03F 2200/516* (2013.01); *H03F 2203/7221* (2013.01); *H03F 2203/7236* (2013.01)

(58) Field of Classification Search
    USPC ................ 330/285, 297, 127, 279, 175, 132
    See application file for complete search history.

(56) References Cited

U.S. PATENT DOCUMENTS

| | | | |
|---|---|---|---|
| 2008/0094142 A1* | 4/2008 | Kawashima | H03F 3/189 330/296 |
| 2011/0003566 A1* | 1/2011 | Makihara | H01Q 23/00 455/127.1 |
| 2012/0092076 A1* | 4/2012 | Kamgaing | H01P 1/212 330/302 |
| 2014/0049273 A1* | 2/2014 | Rocznik | G01R 27/2605 324/679 |
| 2015/0035607 A1* | 2/2015 | Takenaka | H03F 3/21 330/297 |

OTHER PUBLICATIONS

PCT Written Opinion of the International Searching Authority for Application No. PCT/US2015/025580 dated Jul. 15, 2015, 7 pages.

* cited by examiner

BROADBAND POWER AMPLIFIER SYSTEMS AND METHODS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Embodiments of the invention relate to electronic systems, and in particular, to radio frequency (RF) electronics.

RF power amplifiers can be used to boost the power of an RF signal having a relatively low power. Thereafter, the boosted RF signal can be used for a variety of purposes, included driving the antenna of a transmitter.

Power amplifiers can be included in mobile phones to amplify an RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal. It can be important to manage the amplification of an RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

IEEE 802.11 of is a wireless networking standard in the 802.11 family that allows wireless local area network (WLAN) operation in TV white space spectrum. For IEEE Standard 802.11af, a power amplifier to boost the transmitted WiFi signal is used in the band frequencies between approximately 470 MHz to approximately 928 MHz (full band). In a less-than-perfectly linear amplifier, harmonics of the signals at 470 MHz manifest at 940 MHz, which is perilously close to the end of the full band at 928 MHz. In other words, harmonics of the lower frequencies of the full band will be amplified and passed on to the next element in the radio frequency (RF) signal chain unless they are rejected without impacting the operation of the amplifier at the higher frequencies of the full band. Moreover, RF signals below approximately 470 MHz may unintentionally be present in the input RF signal and consequently rejection of harmonics of those signals is needed when operating the amplifier at the lower end of the band.

For efficient, broadband operation of a power amplifier, the output matching network (OMN) of the amplifier should be optimized for all frequencies within the frequency band of operation. However, rejection of harmonic frequencies from the lower part of a wide frequency band is a challenge because the OMN is optimized to match the amplifier at those harmonic frequencies as well, rather than reject them (i.e. twice the frequency of the lower band of frequencies is within the range of the higher band of frequencies).

There is a need for improved broadband power amplifiers. Furthermore, there is a need for improved power amplifier matching networks.

SUMMARY

Systems, devices, and methodologies are disclosed to reduce harmonics in a radio frequency output signal. A power amplifier system comprises a power amplifier and a tunable output matching network electrically connected between the output of the power amplifier and an output of the tunable output matching network. The tunable output matching network reduces second-order harmonics in an amplified radio frequency signal when the power amplifier operates in a low frequency mode. The tunable output matching network includes traps such as a series inductor and a first capacitor in series with a first switch, a second capacitor in series with a second switch, and a third capacitor in series with a third switch, where the traps are tuned to selected harmonic frequencies when the power amplifier operates in the low frequency band of the operating band of frequencies.

In accordance with several implementations, the present disclosure relates to a power amplifier comprising an amplifier circuit configured to receive a radio frequency (RF) signal and provide an amplified RF signal over a frequency band of operation; and a tunable output matching network electrically connected to the amplifier circuit to receive the amplified RF signal and configured to provide second-order harmonic rejection for the amplified RF signal when the amplifier circuit operates in a low frequency band. In an embodiment, a wireless mobile device comprises power amplifier.

In accordance with some embodiments, the frequency band of operation includes the low frequency band of between approximately 470 MHz to approximately 610 MHz and a high frequency band of between approximately 610 MHz to approximately 930 MHz. The power amplifier can include a broadband power amplifier. The tunable output matching network can be further configured to provide impedance matching for the amplifier circuit.

In another embodiment, the amplifier circuit includes an input matching circuit, a first amplifying stage, an interstage matching circuit, and a second amplifying stage, where the tunable output matching network includes a series inductor and first capacitor in series with a first switch, and a second capacitor in series with a second switch, where the tunable output matching network further includes a third capacitor in series with a third switch and where a switched harmonic trap includes the series inductor and first capacitor in series with the first switch, a first switched capacitor element includes the second capacitor in series with the second switch, and a second switched capacitor element includes the third capacitor in series with the third switch. Values of the series inductor, the first capacitor, the second capacitor, and the third capacitor can be selected to trap second-order harmonics of the amplified RF signal.

In a further embodiment, the switched harmonic trap, the first switched capacitor element, and the second switched capacitor element are switched into the tunable matching output network for the low frequency band of operation. In a yet further embodiment, the amplifier circuit, the series inductor, the first capacitor, and the second capacitor are implemented on a silicon germanium (SiGe) die, and the first and second switches are implemented on a silicon on insulator (SOI) die.

According to some implementations, the present disclosure relates to an apparatus comprising a series inductor and a first capacitor connected in series with a first switch; and a second capacitor connected in series with a second switch. In some embodiments, the series inductor and the first capacitor connected in series with the first switch provides a switched harmonic trap, and the second capacitor connected in series with the second switch provides a first switched capacitor element. The switched harmonic trap and the switched capacitor element can provide a tunable output matching network, where the tunable output matching network is configured to reduce second-order harmonics of a radio frequency signal in a low frequency band of between approximately 470 MHz to approximately 610 MHz. In an embodiment, a wireless mobile device comprises the apparatus.

In an embodiment, the first and second switches are implemented on a silicon on insulator (SOI) die and the series inductor, the first capacitor, and the second capacitor are implemented on a silicon germanium (SiGe) die.

In a number of embodiments, the apparatus further comprises a third capacitor in series with a third switch to provide a second switched capacitor element. The switched harmonic trap and the first and second switched capacitor elements can be configured to create short circuits to AC ground for specific harmonic frequencies of a radio frequency signal, where signal energy from the specific harmonic frequencies is reflected back for partial recycling.

In certain implementations, the present disclosure relates to an apparatus comprising a harmonic trap and two switched capacitors. The apparatus is configured to receive an amplified radio frequency (RF) signal and to reduce second-order harmonics when operating in a low frequency band of a full frequency band of operation. The full frequency band of operation includes a range of frequencies between approximately 470 MHz to approximately 930 MHz and the low frequency band includes a range of frequencies between approximately 470 MHz to approximately 610 MHz. In certain implementations, the harmonic trap includes a series inductor and a first capacitor in series with a first switch, and a second capacitor in series with a second switch, values of the series inductor, the first capacitor, and the second capacitor are selected to reduce second-order harmonic frequencies when operating in a low frequency mode.

In a number of implementations, the present disclosure relates to a power amplifier system comprising a power amplifier configured to amplify a radio frequency input signal. The power amplifier includes an input configured to receive the radio frequency input signal and an output configured to generate an amplified radio frequency signal; and an output matching network that includes a harmonic rejection circuit electrically connected between the output of the power amplifier and an output of the power amplifier and an output of the output matching network. The harmonic rejection circuit electrically connected to the output matching network when the power amplifier is operating in a low frequency mode to reduce second-order harmonics in the amplified radio frequency signal.

In an embodiment, the output matching network includes a series inductor and a first capacitor in series with a first switch, and a second capacitor in series with a second switch. The first and second switches are closed when the power amplifier is operating in the low frequency mode. In another embodiment, the output matching network further includes a third capacitor in series with a third switch, where the first, second, and third switches are configured to be in the ON position when the power amplifier is operating in the low frequency mode, and where the first, second, and third switches are configured to be in the OFF position when the power amplifier is operating in a high frequency mode.

In a further embodiment, the output matching network is further configured to reduce third-order harmonics when the power amplifier is operating in the low frequency mode. In a yet further embodiment, the power amplifier includes a broadband power amplifier and is configured to amplify radio frequency signals in the frequency band between approximately 470 MHz to approximately 930 MHz. In another embodiment, the output matching circuit is configured to reduce harmonics of the radio frequency input signal in the amplified radio frequency signal when the power amplifier is operating in a low frequency band of between approximately 470 MHz to approximately 610 MHz.

According to some embodiments, a power amplifier system comprises a power amplifier configured to amplify a radio frequency input signal, the power amplifier including an input configured to receive the radio frequency input signal and an output configured to generate an amplified radio frequency signal; and an output matching network including a harmonic rejection circuit electrically connected between the output of the power amplifier and an output of the output matching network, the harmonic rejection circuit configured to be electrically connected to the output matching network when the power amplifier is operating in a low frequency mode to reduce second-order harmonics in the amplified radio frequency signal.

In an embodiment, the output matching network includes a series inductor and a first capacitor in series with a first switch, and a second capacitor in series with a second switch. The first and second switches are closed when the power amplifier is operating in the low frequency mode. In other embodiments, the output matching network further includes a third capacitor in series with a third switch. In a further embodiment, the first, second, and third switches are configured to be in the ON position when the power amplifier is operating in the low frequency mode, and the first, second, and third switches are configured to be in the OFF position when the power amplifier is operating in a high frequency mode.

In a number of embodiments, the output matching network is further configured to reduce third-order harmonics when the power amplifier is operating in the low frequency mode. In certain embodiments, the power amplifier includes a broadband power amplifier amplifies radio frequency signals in the frequency band between approximately 470 MHz to approximately 930 MHz. In yet further embodiments, the output matching circuit is configured to reduce harmonics of the radio frequency input signal in the amplified radio frequency signal when the power amplifier is operating in a low frequency band of between approximately 470 MHz to approximately 610 MHz.

According to several embodiments, the disclosure relates to a power amplifier module comprising an input pin configured to receive a radio frequency input signal; an output pin configured to provide an amplified radio frequency signal; a power amplifier die including an amplifier circuit, an input pad electrically connected to the input pin, and an output pad electrically connected to the output pin, the power amplifier die further including a series inductor and a first capacitor configured to be in series with a first switch, a second capacitor configured to be in series with a second switch, and a third capacitor configured to be in series with a third switch; a switch die including the first, second, and third switches; and a plurality of interconnections configured to electrically connect the series inductor and the first capacitor with the first switch to provide a first harmonic trap, to electrically connect the second capacitor to the second switch to provide a second harmonic trap, and to electrically connect the third capacitor to the third switch to provide a third harmonic trap. The first, second, and third switches can be configured to be in an ON position when the amplifier circuit operates in a low frequency band to reduce second-order harmonics in the amplified radio frequency signal. In an embodiment, a wireless mobile device comprises the power amplifier module.

In an embodiment, an output matching network includes the first, second, and third harmonic traps. In another embodiment, the first, second, and third switches are configured to be in an OFF position when the amplifier circuit operates in a high frequency band, where a frequency range of operation is between approximately 470 MHz to approximately 930 MHz, the low frequency band is between approximately 470 MHz to approximately 610 MHz, and the high frequency band is between approximately 610 MHz to approximately 930 MHz.

In accordance with a number of embodiments, a wireless mobile device comprises an antenna configured to receive and transmit radio frequency signals; a power amplifier configured to amplify a radio frequency input signal, the power amplifier including an input configured to receive the radio frequency input signal and an output configured to provide an amplified radio frequency signal; an output matching network including a harmonic rejection circuit electrically connected between the output of the power amplifier and an output of the output matching network, the harmonic rejection circuit configured to be electrically connected to the output matching network when the power amplifier is operating in a low frequency mode to reduce second-order harmonics in the amplified radio frequency signal; and a transmit/receive switch configured to pass the amplified radio frequency signal to the antenna for transmission.

In an embodiment, the harmonic rejection circuit includes a series inductor and a first capacitor connected in series with a first switch, and a second capacitor connected in series with a second switch, where the series inductor, the first capacitor, the second capacitor, and the power amplifier are implemented on a first die, and the first and second switches are implemented on a second die. The first die can be fabricated using silicon germanium (SiGe) technology and the second die is fabricated using silicon on insulator (SOI) technology. In another embodiment, the power amplifier includes a broadband power amplifier.

In a number of implementations, the present disclosure relates to a method to reduce harmonics in a radio frequency output signal. The method comprises receiving along a radio frequency path at an input to a power amplifier circuit a radio frequency signal having a fundamental frequency in a band of operating frequencies; amplifying the radio frequency signal to provide an amplified radio frequency signal; matching an impedance of the power amplifier to an impedance of a next element in the radio frequency path; and filtering the amplified radio frequency signal with a harmonic rejection filter to reduce second-order harmonic frequencies when the power amplifier is operating in a low frequency band, the harmonic rejection filter including a switched harmonic trap, a first switched capacitor element, and a second switched capacitor element.

In an embodiment, the band of operating frequencies is between approximately 470 MHz to approximately 930 MHz, and the low frequency band is between approximately 470 MHz to approximately 610 MHz. In another embodiment, the method further comprises closing switches in the harmonic rejection filter when the power amplifier is operating in the low frequency band. In a further embodiment, the method further comprises electrically connecting a first capacitor to a first switch to form the first switched capacitor element, electrically connecting a second capacitor to a second switch to form the second switched capacitor element, and electrically connecting a series inductor and third capacitor to a third switch to form the switched harmonic trap.

According to a number of embodiments, a power amplifier comprises an amplifier circuit configured to receive a radio frequency (RF) signal and provide an amplified RF signal over a frequency band of operation, and a tunable output matching network electrically connected to the amplifier circuit to receive the amplified RF signal and configured to provide second-order harmonic rejection for the amplified RF signal when the amplifier circuit operates in a low frequency band.

In an embodiment, the frequency band of operation includes the low frequency band of between approximately 470 MHz to approximately 610 MHz and a high frequency band of between approximately 610 MHz to approximately 930 MHz. In another embodiment, the power amplifier includes a broadband power amplifier. In a further embodiment, the tunable output matching network includes a series inductor and first capacitor in series with a first switch to form a switched harmonic trap, and a second capacitor in series with a second switch to form a first switched capacitor element. In a further embodiment, the tunable output matching network further includes a third capacitor in series with a third switch to form a second switched capacitor element. In a yet further embodiment, values of the series inductor, the first capacitor, the second capacitor, and the third capacitor are selected to trap second-order harmonics of the amplified RF signal.

In an embodiment, the switched harmonic trap, the first switched capacitor element, and the second switched capacitor element are switched into the tunable matching output network for the low frequency band of operation. In another embodiment, the amplifier circuit, the series inductor, the first capacitor, the second capacitor, and the third capacitor are implemented on a silicon germanium (SiGe) die, and the first, second, and third switches are implemented on a silicon on insulator (SOI) die. In a further embodiment, the switched harmonic trap and the first and second switched capacitor elements are configured to create short circuits to AC ground for specific harmonic frequencies of the amplified radio frequency signal. In a yet further embodiment, signal energy from the specific harmonic frequencies is reflected back to the amplifier circuit for partial recycling. In another embodiment, a wireless mobile device comprises the power amplifier.

According to some embodiments, a power amplifier module comprises an input pin configured to receive a radio frequency input signal, an output pin configured to provide an amplified radio frequency signal, a power amplifier die including an amplifier circuit, an input pad electrically connected to the input pin, and an output pad electrically connected to the output pin, where the power amplifier die further includes a series inductor and a first capacitor configured in series with a first switch, a second capacitor configured in series with a second switch, and a third capacitor configured in series with a third switch, a switch die including the first, second, and third switches, and a plurality of interconnections configured to electrically connect the series inductor and the first capacitor with the first switch to provide a first harmonic trap, electrically connect the second capacitor to the second switch to provide a second harmonic trap, and to electrically connect the third capacitor to the third switch to provide a third harmonic trap, where the first, second, and third switches are configured to be in an ON position when the amplifier circuit operates in a low frequency band to reduce second-order harmonics in the amplified radio frequency signal.

In an embodiment, values of the series inductor, the first capacitor, the second capacitor and the third capacitor are selected to reduce the second-order harmonic frequencies when operating in a low frequency mode. In another embodiment, a frequency range of operation is between approximately 470 MHz to approximately 930 MHz and includes the low frequency band of between approximately 470 MHz to approximately 610 MHz, and a high frequency band of between approximately 610 MHz to approximately 930 MHz. In a further embodiment, the power amplifier die includes a silicon germanium (SiGe) die, and the switch die includes a silicon on insulator (SOI) die. In a yet further embodiment, a wireless mobile device comprises the power amplifier module.

In a number of implementations, a method to reduce harmonics in a radio frequency output signal comprises receiving along a radio frequency path at an input to a power amplifier circuit a radio frequency signal having a fundamental frequency in a band of operating frequencies, amplifying the radio frequency signal to provide an amplified radio frequency signal, matching an impedance of the power amplifier to an impedance of a next element in the radio frequency path, and filtering the amplified radio frequency signal with a harmonic rejection filter to reduce second-order harmonic frequencies when the power amplifier is operating in a low frequency band, where the harmonic rejection filter includes a switched harmonic trap, a first switched capacitor element, and a second switched capacitor element.

In an embodiment, the band of operating frequencies is between approximately 470 MHz to approximately 930 MHz, and the low frequency band is between approximately 470 MHz to approximately 610 MHz. In another embodiment, the method further comprises closing switches in the harmonic rejection filter when the power amplifier is operating in the low frequency band. In a further embodiment, the method further comprises electrically connecting a first capacitor to a first switch to form the first switched capacitor element, electrically connecting a second capacitor to a second switch to form the second switched capacitor element, and electrically connecting a series inductor and third capacitor to a third switch to form the switched harmonic trap.

DETAILED DESCRIPTION OF CERTAIN EMBODIMENT

Figure 1:
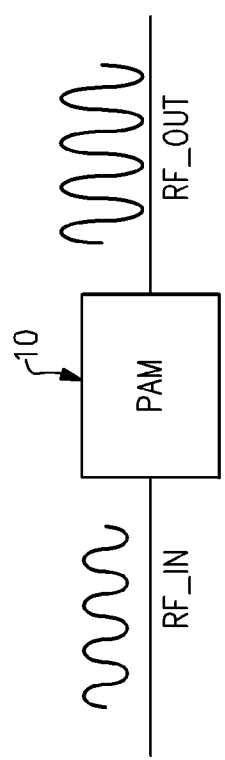
FIG. 1 is a schematic diagram of a power amplifier module for amplifying a radio frequency (RF) signal, according to certain embodiments.

FIG. 1 is a schematic diagram of a power amplifier module for amplifying a radio frequency (RF) signal. The illustrated power amplifier module (PAM) 10 can be configured to amplify an RF signal RF_IN to generate an amplified RF signal RF_OUT. As described herein, the power amplifier module 10 can include one or more power amplifiers.

Figure 2:
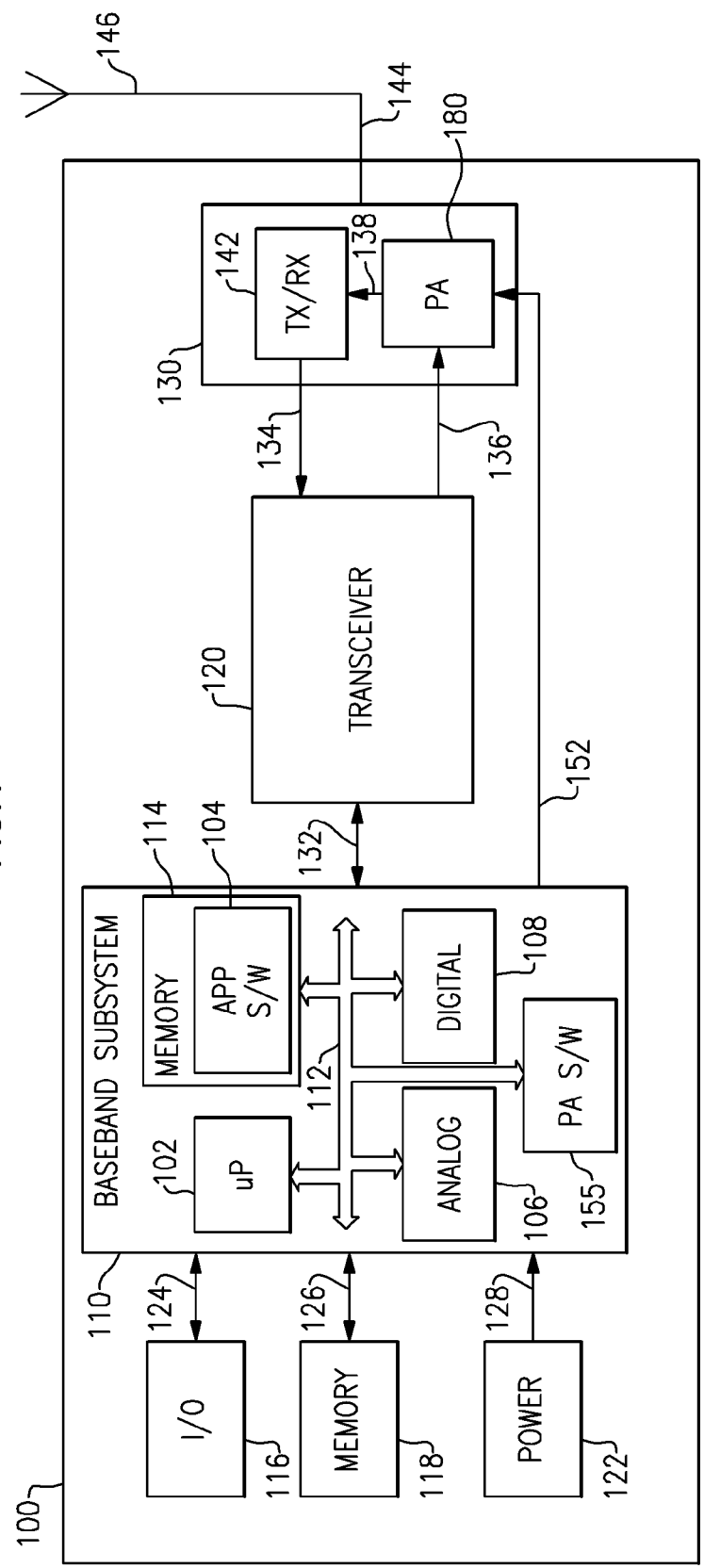
FIG. 2 is a schematic block diagram of an exemplary wireless device that can include one or more of the power amplifier modules of FIG. 1, according to certain embodiments.

FIG. 2 is a schematic block diagram illustrating a simplified portable communication device 100 that can include one or more of the power amplifier modules 10 of FIG. 1. The portable communication device 100 can include power amplifiers implementing one or more features of the present disclosure.

In an embodiment, the portable communication device or mobile device 100 can be a portable cellular telephone. The portable communication device 100 illustrated in FIG. 1 is intended to be a simplified example of a cellular telephone and to illustrate one of many possible applications in which the power amplifier module 10 can be implemented. One having ordinary skill in the art will understand the operation of a portable cellular telephone, and, as such, implementation details are omitted. The portable communication device 100 includes a baseband subsystem 110, a transceiver 120, and a front-end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem 110 generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is electrically connected to the baseband subsystem 110 over connection 124, a memory element 118 is coupled to the baseband subsystem 110 over connection 126, and a power source 122 is electrically connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and, in an embodiment, can be non-volatile memory that stores the application software 104. If portions of the multi-mode power amplifier are implemented in software, then the baseband subsystem 110 also includes power amplifier software 155, which may cooperate with control logic that can be executed by the microprocessor 102, or by another processor, to control the operation of the power amplifier 180 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 180. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 180. As will be described in detail below, the power amplifier 180 can be implemented as a broadband power amplifier. The output of the power amplifier 180 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides a power or mode selection signal over connection 152 to the power amplifier 180. The mode selection signal determines whether one or more amplification paths within the power amplifier 180 are enabled.

Figure 3:
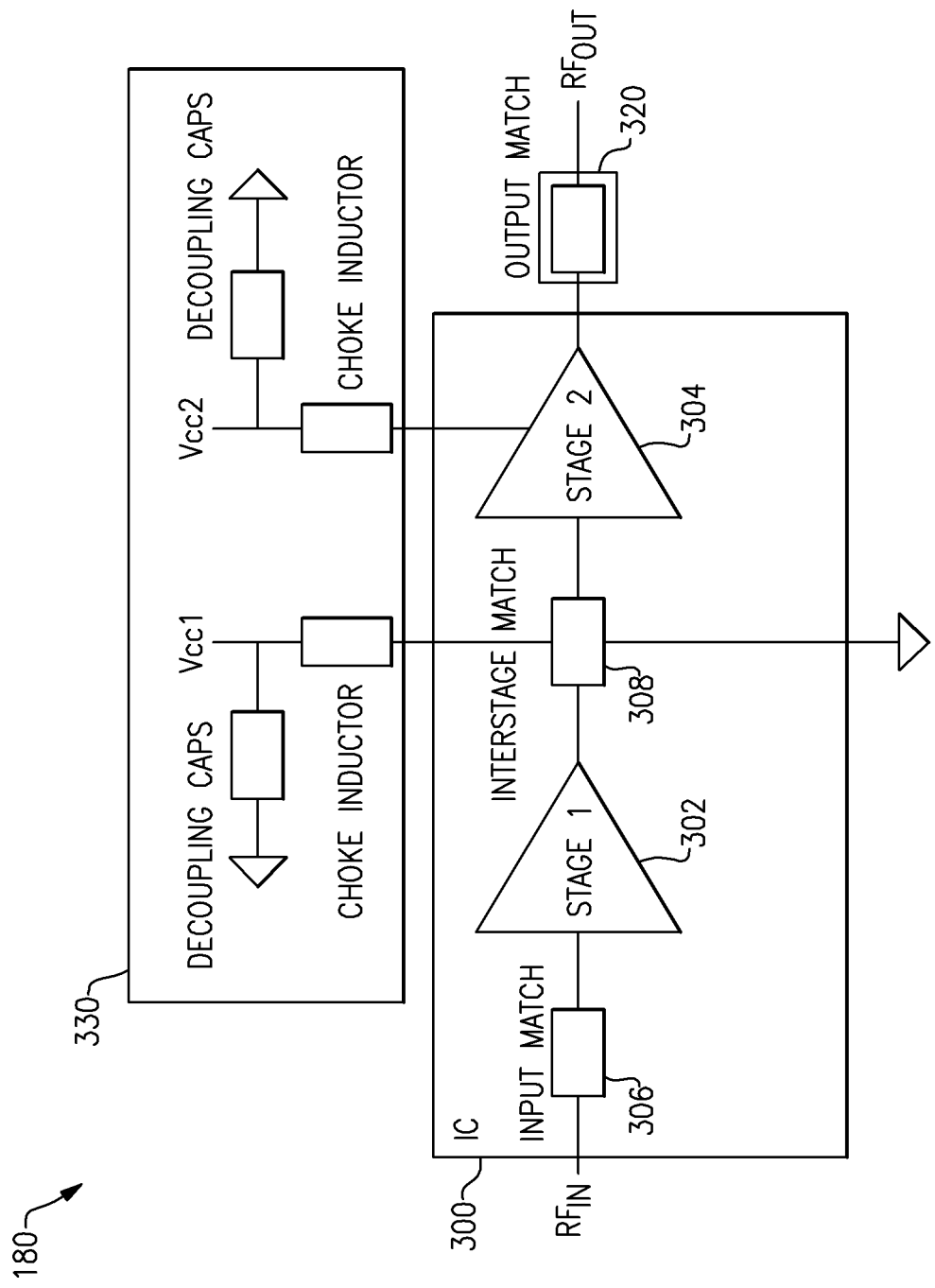
FIG. 3 is a schematic block diagram of one example of a power amplifier system including a broadband power amplifier, according to certain embodiments.

FIG. 3 is a schematic block diagram of an embodiment of the power amplifier module 180. The illustrated power amplifier module 180 of FIG. 3 includes a broadband power amplifier 300, an output matching network 320, and additional components 330. The illustrated broadband power amplifier 300 includes a first amplifier stage 302, a final amplifier stage 304, an input matching circuit 306, and an interstage matching circuit 308. Although the illustrated example shows two amplifier stages, it is well known to one of skill in the art that more than two amplifier stages or less than two amplifier stages can be used to implement the broadband power amplifier 300.

The broadband power amplifier 300 receives the RF input signal at an input to the input matching circuit 306. An output of the input matching circuit 306 is electrically connected to an input of the first amplifier stage 302 and the output of the first amplifier stage 302 is electrically connected to an input of the interstage matching circuit 308. A first output of the interstage matching circuit 308 couples to ground through an inductor (not shown) and a second output of the interstage matching circuit 308 is electrically connected to an input of the second amplifying stage 304. An output of the second amplifying stage 304 is electrically connected to an input of the output matching circuit 320. An output of the output matching circuit 320 provides the RF output signal, which can be forwarded to the TX/RX switch 142.

The power amplifier circuit 300 further connects to the additional components 330, such as decoupling capacitors, choke inductors, and the like for proper operation of the power amplifier circuit 300 as is known to one of skill in the art from the disclosure herein.

The input matching circuit 306 can be used to match the output impedance of the RF signal from the baseband system 110 to the input impedance of the first amplifier stage 302 and the interstage matching circuit 304 can be used to match the output impedance of the previous amplifier stage to the input impedance of the next amplifier stage.

The output matching network 320 can be included at the output of the power amplifier 300. The output matching network 320 can be used to increase power transfer and/or reduce reflections of the amplified RF signal generated by the power amplifier 300.

There are several concepts relating to amplifier matching. The output matching network 320 matches the output impedance of the amplifier 300 to the input impedance of the next RF sub-system in the signal chain. In a conventional embodiment, this is typically 50 ohms. Harmonic frequencies are integer multiples of the RF signal frequency being amplified and it is conducive to the efficient and low-distortion operation of the power amplifier 300 that such harmonic frequencies are rejected by the output matching network 320. Rejection of the harmonic frequencies reduces the magnitude of signals at those frequencies from being emitted by the amplifier 300.

Referring to FIG. 3, the illustrated embodiment shows a single broadband power amplifier die 300 and a static output matching network 320. For IEEE Standard 802.11af, the power amplifier 180 boosts the transmitted WiFi signal in the band frequencies between approximately 470 MHz to approximately 928 MHz (the full band). While there are fewer parts to implement the broadband amplifier 300 using a single power amplifier die 300, the harmonics of 470 MHz are close to the upper frequencies of the band and can be difficult to reject using passive components in the static output matching network 320. Thus, in certain embodiments, the desired harmonic rejection is not met.

Figure 4:
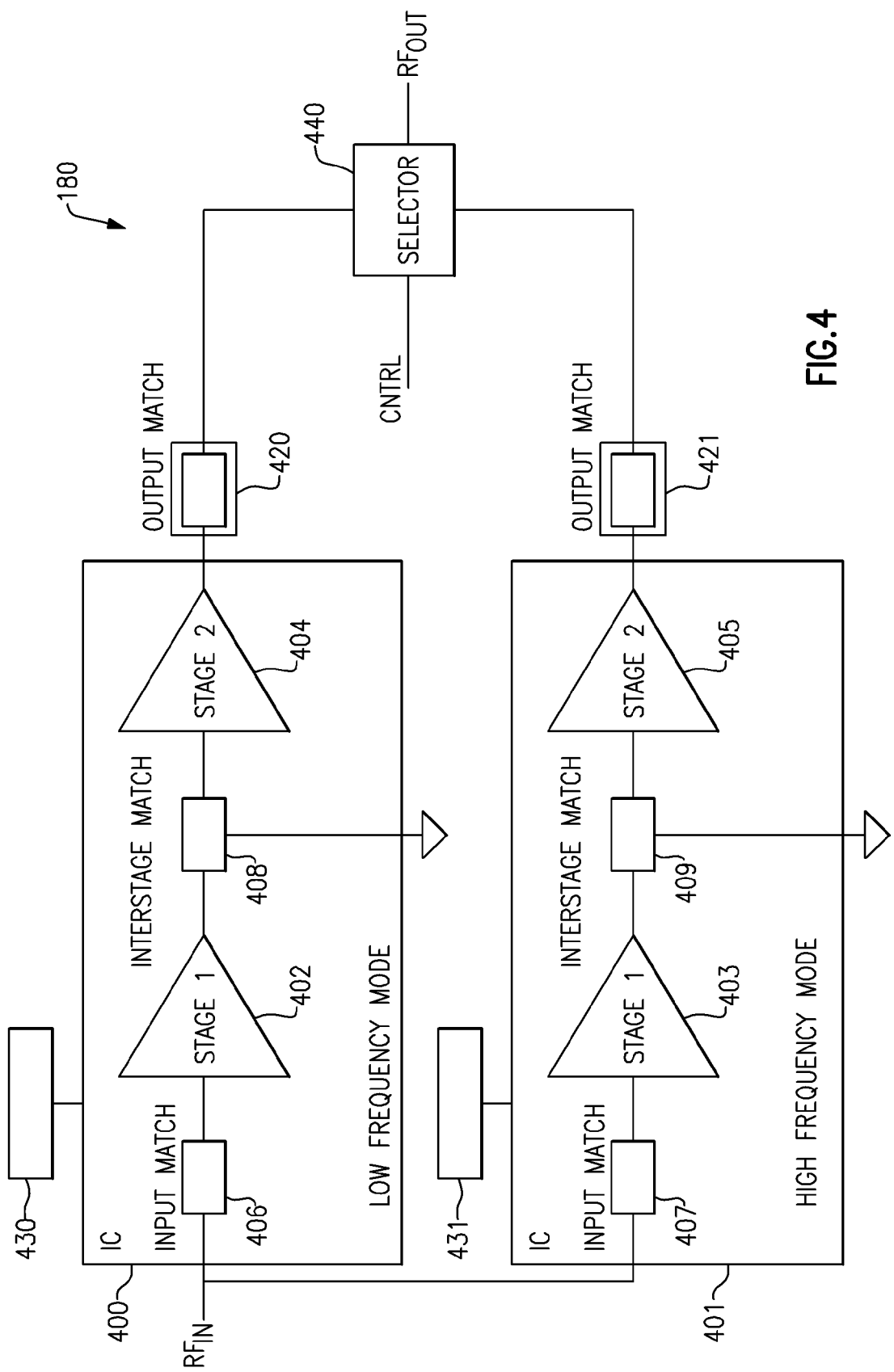
FIG. 4 is a schematic block diagram of another example of a power amplifier system including a broadband power amplifier, according to certain embodiments.

FIG. 4 is another embodiment of the power amplifier module 180. In the illustrated power amplifier module of FIG. 4, the single power amplifier 300 is replaced with two power amplifier integrated circuits 400, 401, each with corresponding static output matching network 420, 421 configured to eliminate or reduce the harmonics in the corresponding operating band of frequencies. Each power amplifier circuit 400, 401 is associated with additional components 430, 431, respectively, similar to the decoupling capacitors, choke inductors, etc. of the additional components 330.

Each power amplifier circuit 400, 401 receives the RF input signal. In another embodiment, the power amplifier circuit 400 receives the RF input signal having a fundamental frequency in a low band of the full band operating frequencies and the power amplifier circuit 401 receives the RF input signal having the fundamental frequency in a high band of the full band of operating frequencies. An output of the first RF amplifier circuit 400 is electrically connected to the output matching circuit 420 and an output of the output matching circuit 420 is electrically connected to a first input of a selector 440. An output of the second RF amplifier circuit 401 is electrically connected to the output matching circuit 421 and an output of the output matching circuit 421 is electrically connected to a second input of the selector 440. The selector 440 receives a control signal to select either the output of the output matching circuit 420 or the output of the matching circuit 421 as the RF output signal, which can be forwarded to the TX/RX switch 142. In an embodiment, the control signal is generated in the baseband subsystem 110.

The first power amplifier circuit 400 comprises an input matching circuit 406, a first amplifier stage 402, an interstage matching circuit 408, and a second amplifying stage 404. The input matching circuit 406, the first amplifier stage 402, the interstage matching circuit 408, and the second amplifying stage 404 are connected as described above with respect to the power amplifier 300. Similarly, the second power amplifier circuit 401 comprises an input matching circuit 407, a first amplifier stage 403, an interstage matching circuit 409, and a second amplifying stage 405. The input matching circuit 406, the first amplifier stage 403, the interstage matching circuit 407, and the second amplifying stage 405 are connected as describe above with respect to the power amplifier 300.

The first power amplifier circuit 400 amplifies RF signals at the lower end of the band while the second power amplifier circuit 401 amplifies the RF signals at the upper half of the full band of frequencies. Determining the lower end and the upper half of the band is based at least in part on a tradeoff between competing requirements for harmonic distortion and current dispersion limits.

The harmonic distortion improves as frequency increases. The second-order harmonic distortion can be a limiting factor in circuit optimization and the upper frequency should be well below the second-order harmonic distortion of the lowest frequency. Otherwise, the load at the upper frequency can be non-optimum, leading to high current dissipation. In addition, the selection of band limits is determined by current dispersion, which is related to the second-order harmonic distortion rejection.

One method to define the lower and upper bands is to define the upper frequency, and optimize the circuit for successively smaller lower frequency limits until the current dispersion becomes undesirable. Another method is to reverse the above method by defining the lower frequency limit and optimizing the circuit for successively larger upper frequency limits until the current dispersion becomes unacceptable.

In one embodiment, the low band power amplifier 400 operates in the band of frequencies between approximately 470 MHz to approximately 670 MHz and has a second-order harmonic rejection of approximately −58 dBc corresponding to −36 dBm/MHz at Pout=22 dBm and a third-order harmonic rejection of approximately −75 dBc corresponding to −53 dBm/MHz at Pout=22 dBm. The high band power amplifier 401 operates in the band of frequencies between approximately 670 MHz to approximately 930 MHz and has a second-order harmonic rejection of approximately −50 dBc corresponding to −28 dBm/MHz at Pout=22 dBm and a third-order harmonic rejection of approximately −70 dBc corresponding to −48 dBm/MHz at Pout=22 dBm. This is one non-limiting example of a low band power amplifier and a high band power amplifier configured to meet desired harmonic distortion and current dispersion characteristics. Other embodiments can have different lower and upper frequency bands within the full band of frequencies, and/or different desired harmonic distortion rejection and current dissipation.

While the desired harmonic rejection and/or current dissipation can be met in certain embodiments using two power amplifier integrated circuits, there are more components using more printed circuit board area and more die area with correspondingly increased costs.

It would be beneficial to devise an output matching network that is responsive to the frequency of operation (or a signal related thereto) such that harmonic frequencies related to the lower band of frequencies are rejected while the amplifier is operating in the lower band of frequencies. As will be described in further detail below, combinations of inductance and capacitance within an output matching network can be devised to create harmonic traps (rejection) for select bands of frequencies, and at the same time ensure gain uniformity over in-band frequencies. These traps can create a short-circuit (to AC ground) for those harmonic frequencies thereby forcing the AC voltage to zero and reflecting the signal energy back into the broadband power amplifier for partial recycling.

Figure 5:
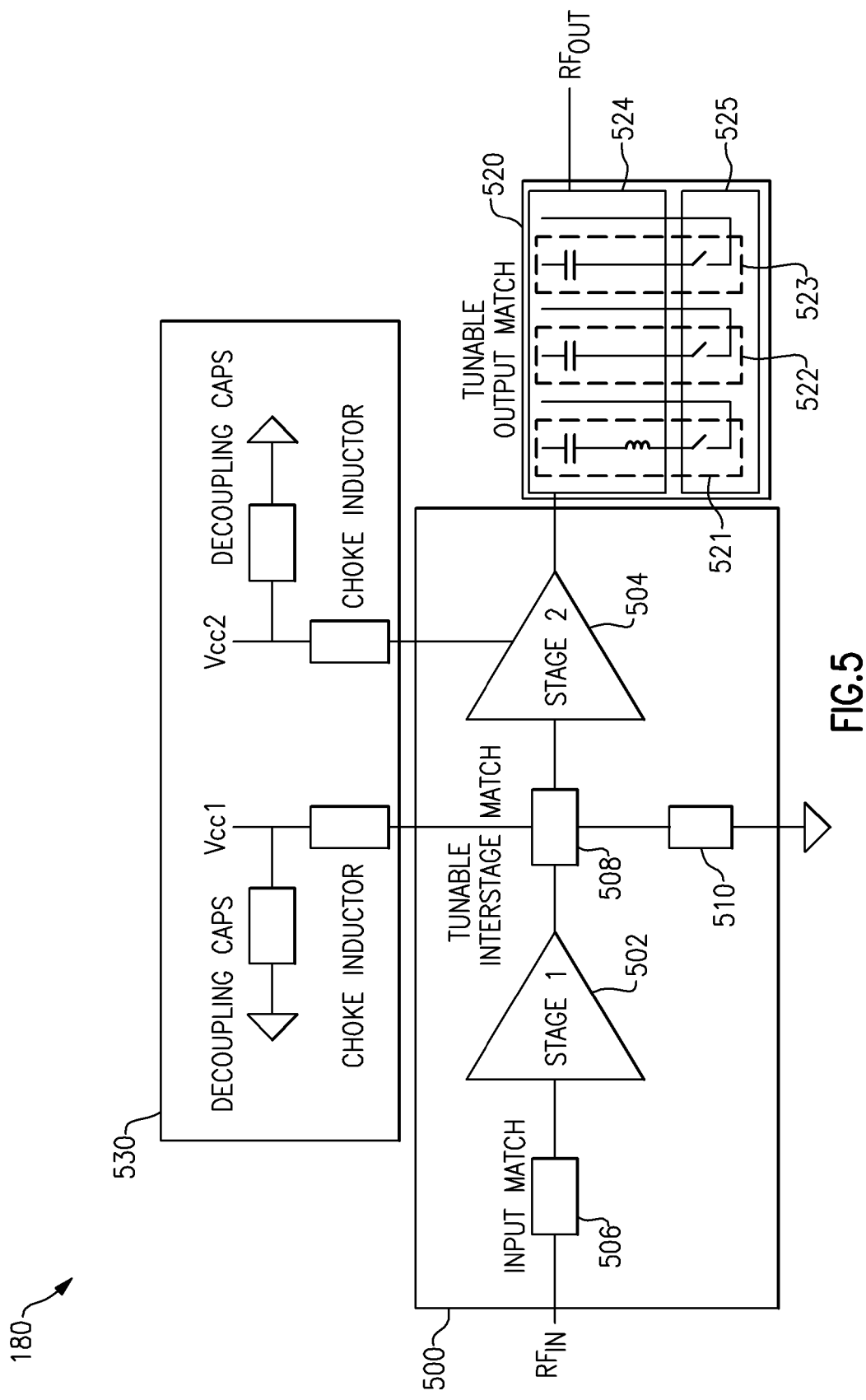
FIG. 5 is a schematic block diagram of another example of a power amplifier system including a broadband power amplifier, a tunable interstage matching circuit, and a tunable output matching network, according to certain embodiments.

FIG. 5 is a schematic block diagram of another embodiment of the power amplifier module 180. The illustrated embodiment of FIG. 5 comprises a broadband power amplifier 500, a tunable output matching network 520, and additional components 530. Broadband power amplifier 500 is electrically connected to the additional components 530, such as decoupling capacitors, choke inductor, and the like, similar to the additional components 330 of FIG. 3.

The broadband power amplifier 500 comprises an input matching circuit 506, a first amplifying stage 502, a tunable interstage matching circuit 508, and a second amplifying stage 504. Although the illustrated example shows two amplifier stages, it is well known to one of skill in the art that more than two amplifier stages or less than two amplifier stages can be used to implement the broadband power amplifier 500.

The broadband power amplifier 500 receives the RF input signal at an input to the input matching circuit 506. An output of the input matching circuit 506 is electrically connected to an input of the first amplifier stage 502 and the output of the first amplifier stage 502 is electrically connected to an input of the interstage matching circuit 508. A first output of the interstage matching circuit 508 couples to ground through inductor 510 and a second output of the interstage matching circuit 508 is electrically connected to an input of the second amplifying stage 504. An output of the second amplifying stage 504 is electrically connected to an input of the tunable output matching circuit 520. An output of the tunable output matching circuit 520 provides the RF output signal, which can be forwarded to the TX/RX switch 142.

The tunable output matching network 520 comprises a plurality of traps 521, 522, 523, such as the switched harmonic trap 521, the first switched capacitor 522, and the second switched capacitor 523. In other embodiments, the tunable output matching network 520 comprises more than one switched harmonic trap 521, and one or more switched capacitors 522, 523. The switched harmonic trap 521 comprises a series capacitor and inductor in series with a switch. Each switched capacitor 522, 523 comprises a capacitor in series with a switch. The traps 521, 522, 523 create a short circuit to ground for those harmonic frequencies for which they are tuned. The traps 521, 522, 523 can be tuned to specific frequency by choosing the appropriate component values, as is known to one of skill in the art from the disclosure herein.

In an embodiment, the broadband power amplifier 500 can be implemented on an integrated circuit (IC) using, for example, SiGe BiCMOS (5PAe) technology, GaAs HBT4 technology, and the like. In an embodiment, the components 524 of the tunable output matching network 520 can be implemented on the same die as the broadband power amplifier 500 and the switches 525 can be implemented on another IC using silicon on insulator (SOI) technology. In other embodiments, other technologies known to one of skill in the art of integrated circuit fabrication can be used. Thus, the power amplifier embodiment of FIG. 5 can comprise a dual band power amplifier comprising one 5PAe die and a SOI switch die.

The broadband power amplifier of FIG. 5 provides switching to implement second-order harmonic traps in the tunable output matching network 520 for the benefit of operation within the frequency band between approximately 470 MHz to approximately 610 MHz, in an embodiment. In one embodiment, the tunable output matching network 520 adds a third-order inductance matching section to the two switched capacitor elements 522, 523, and the harmonic switch trap 521. The third-order inductance matching section enhances the bandwidth of matching. The two switched capacitor elements 522, 523 and the harmonic switch trap 521 increase the harmonic rejection of harmonic signals of the lower band of frequencies (approximately 470 MHz-610 MHz) and maintain gain uniformity of in-band frequencies.

Figure 6:
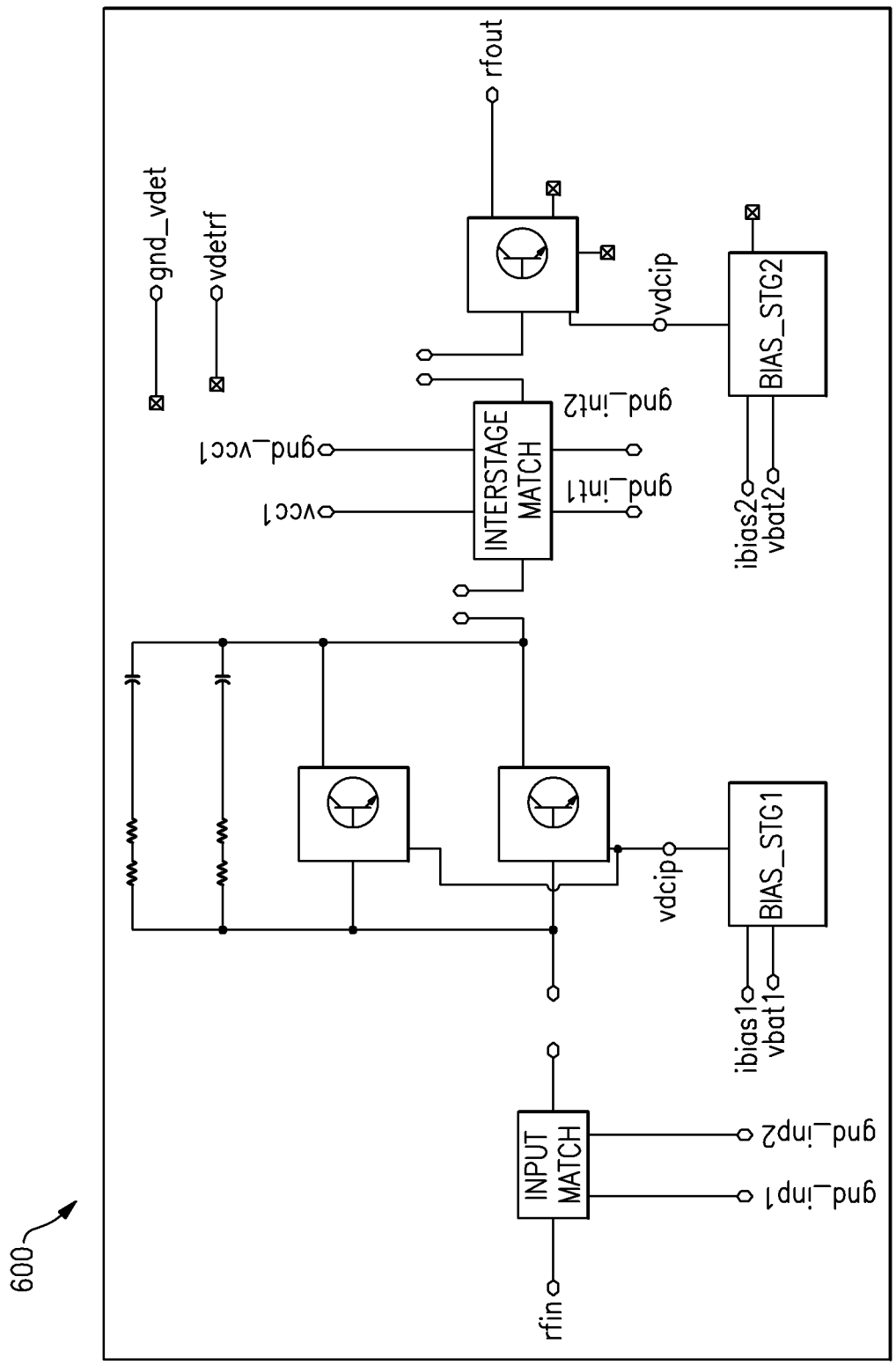
FIG. 6 is a schematic diagram of an exemplary power amplifier of FIG. 5, according to certain embodiments.

FIGS. 6-9 are schematic diagrams of embodiments of the power amplifier module of FIG. 5. FIG. 6 is a schematic diagram of an exemplary power amplifier 600. In an embodiment, the power amplifier 600 can be implemented as a 5PAe IC using SiGe BiCMOS technology.

Figure 7:
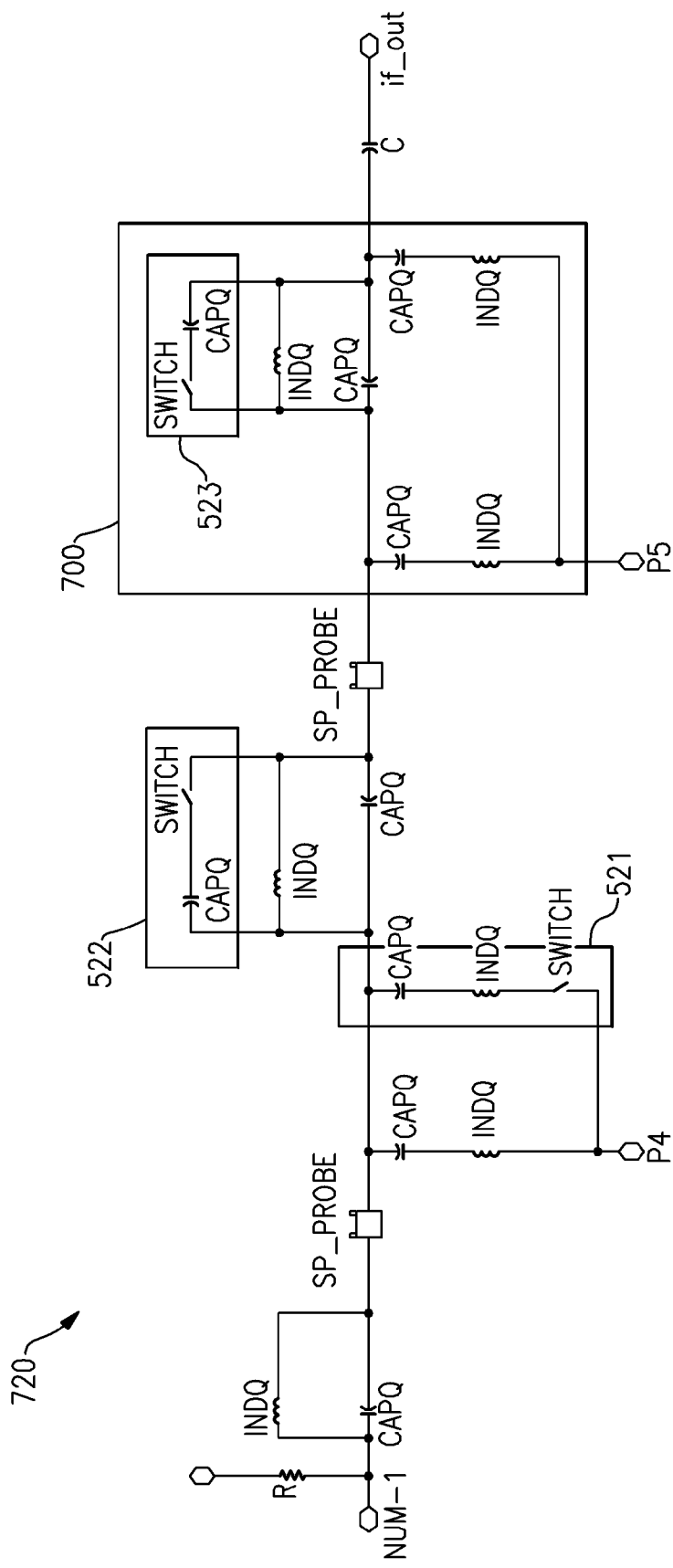
FIG. 7 is a schematic diagram of an exemplary tunable output matching network for low band harmonic rejection that can be used with the power amplifier of FIG. 6, according to certain embodiments.

FIG. 7 is a schematic diagram of an exemplary tunable output matching network 720 for low band (approximately 470 MHz-610 MHz) harmonic rejection that can be used with the power amplifier 600 of FIG. 6. The tunable output matching network 720 comprises the switched harmonic trap 521, the switched capacitor 522, and a third-order inductance-matching section 700, which includes the switched capacitor 523. The third-order inductance-matching section 700 enhances the bandwidth of the tunable output matching network 720. The two switched capacitors 522, 523 and the switched harmonic trap 521 enhance the harmonic rejection of an octave BW 802.11 of power amplifier in low band operation (approximately 470 MHz-610 MHz).

Figure 8:
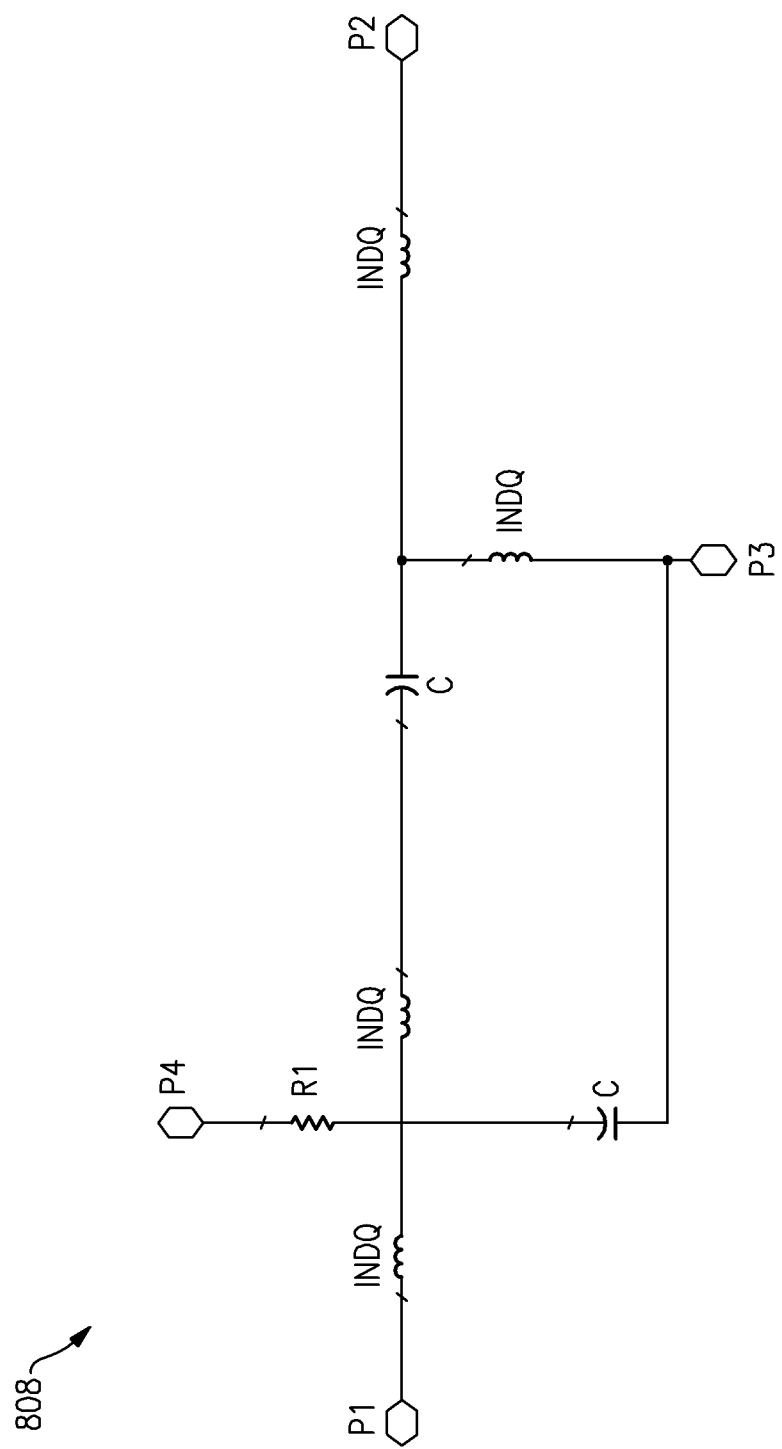
FIG. 8 is a schematic diagram of an exemplary interstage matching circuit that can be used with the power amplifier of FIG. 6, according to certain embodiments.
Figure 9:
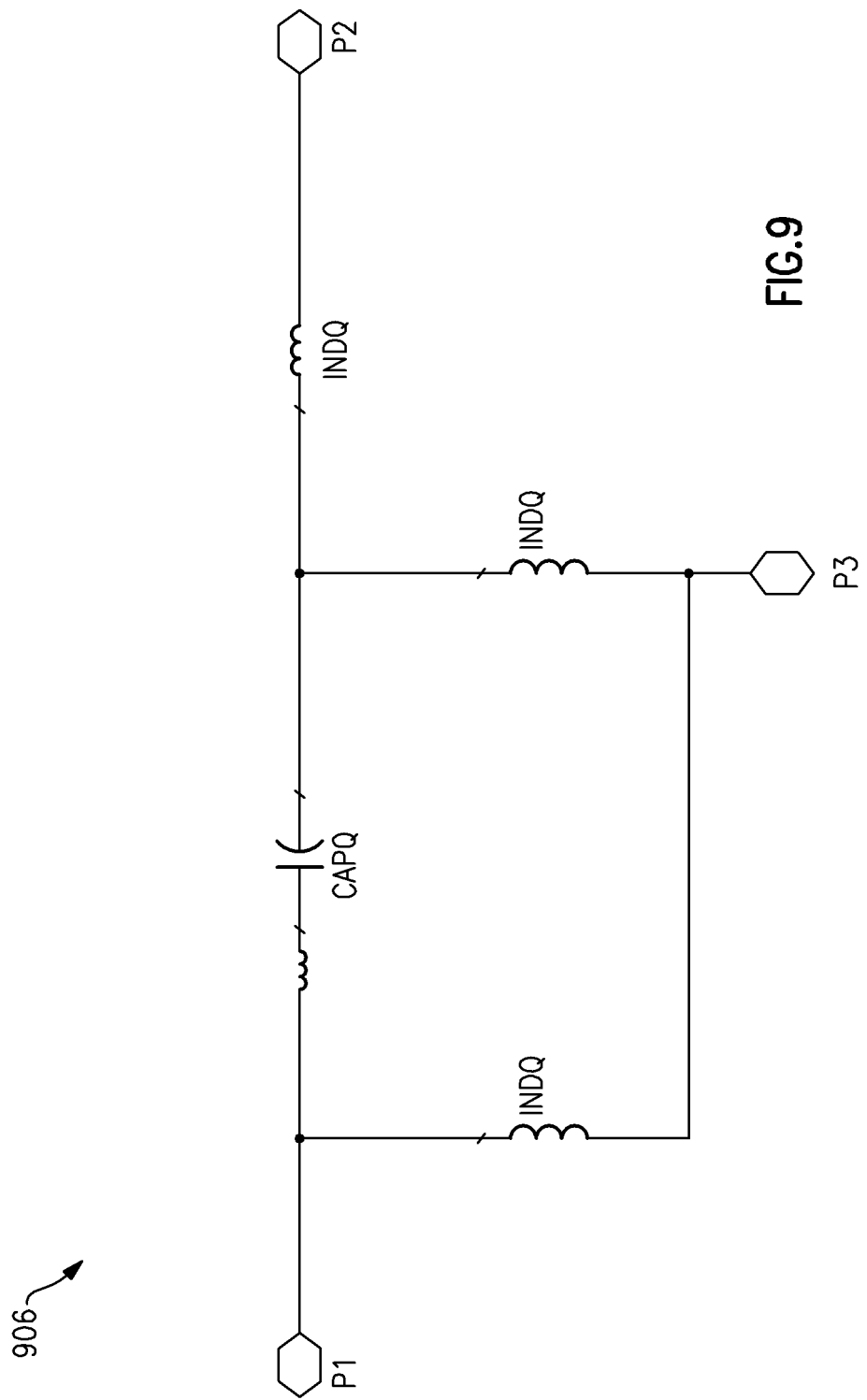
FIG. 9 is a schematic diagram of an exemplary input matching circuit that can be used with the power amplifier of FIG. 6, according to certain embodiments.

FIG. 8 is a schematic diagram of an exemplary interstage matching circuit 808 that can be used with the power amplifier 600 of FIG. 6, and FIG. 9 is a schematic diagram of an exemplary input matching circuit 906 that can be used with the power amplifier 600 of FIG. 6.

Figure 10A:
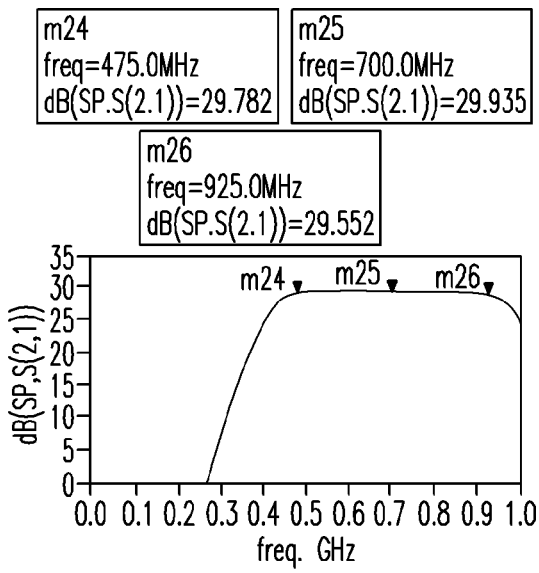
FIGS. 10A-10C are graphs showing the small-signal performance of embodiments of the broadband power amplifier described herein.
Figure 10B:
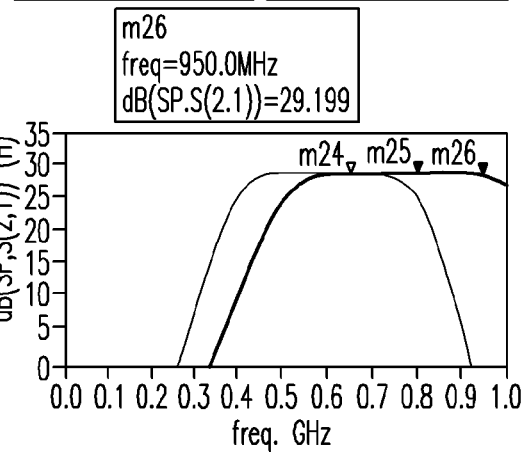
Figure 10C:
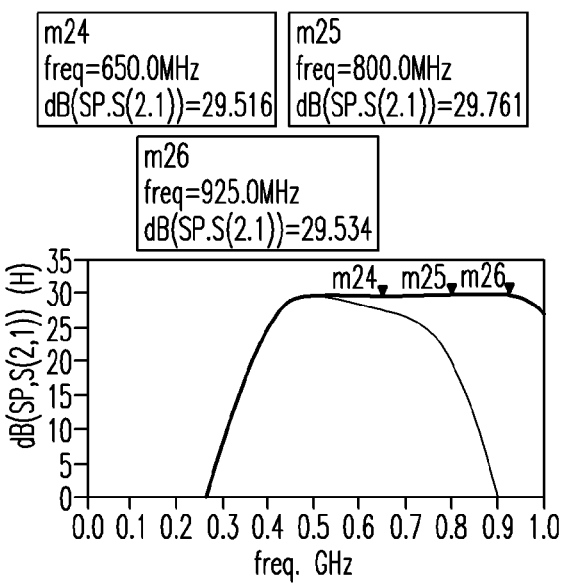

FIGS. 10A-10C are graphs showing the small-signal performance of embodiments of the broadband power amplifier described herein. The curves illustrate gain dB(SP.S(2,1)) verses frequency. FIG. 10A is a graph illustrating the small-signal performance of the single broadband power amplifier embodiment of FIG. 3 over the full band of frequencies. FIG. 10B is a graph illustrating the small-signal performance of the two amplifier embodiment of FIG. 4. As described above, one of the power amplifier circuits operates in a low frequency mode (approximately 470 MHz-670 MHz), illustrated by the thinner lines in FIG. 10B, and the other power amplifier circuit operates in a high frequency mode (approximately 670 MHz-930 MHz) indicated by the thicker lines in FIG. 10B. FIG. 10C is a graph illustrating the small-signal performance of the amplifier and switch embodiment of FIG. 5 where the thinner lines in FIG. 10C indicate operation in the low frequency mode (approximately 470 MHz-610 MHz) and the thicker lines in FIG. 10C indicate operation in the high frequency mode (approximately 610 MHz-930 MHz).

Figure 11A:
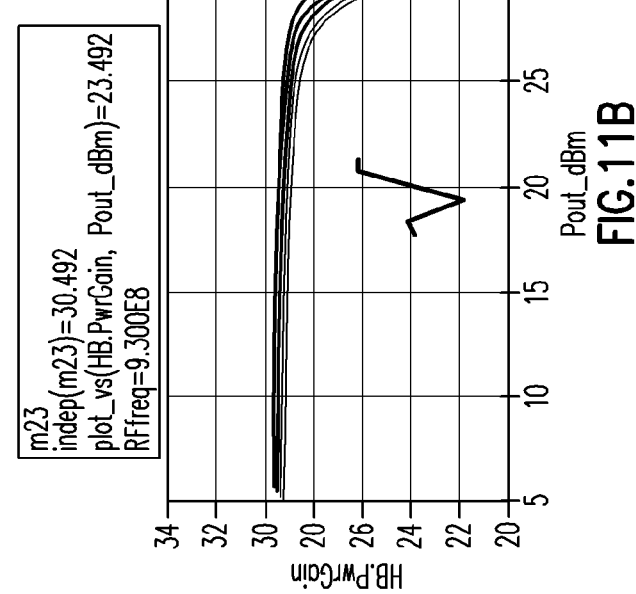
FIGS. 11A-11C are graphs showing the gain performance of embodiments of the broadband power amplifier described herein.
Figure 11B:
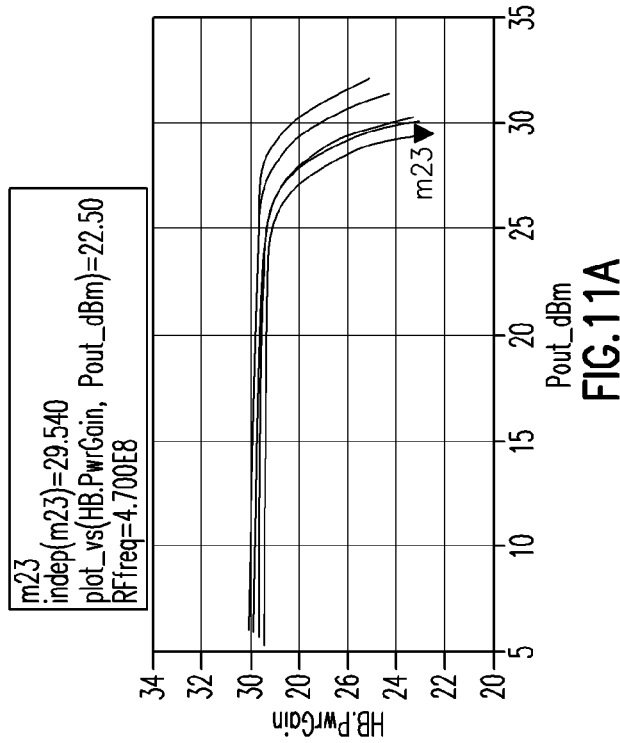
Figure 11C:
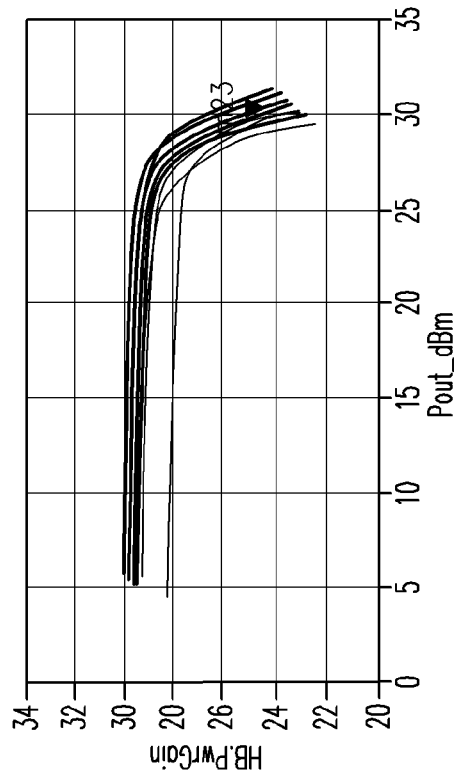

FIGS. 11A-11C are graphs showing the gain performance of embodiments of the broadband power amplifier described herein. The curves illustrate the power gain versus the output power. FIG. 11A is a graph illustrating the gain performance of the single broadband power amplifier embodiment of FIG. 3. FIG. 11B is a graph illustrating the gain performance of the two amplifier embodiment of FIG. 4 where the curves indicated by thinner lines indicate operation in the low frequency mode (approximately 470 MHz-670 MHz) and the curves indicated by the thicker lines indicate operation in the high frequency mode (approximately 670 MHz-930 MHz). FIG. 11C is a graph illustrating the gain performance of the amplifier and switch embodiment of FIG. 5 where the curves indicated by thinner lines indicate operation in the low frequency mode (approximately 470 MHz-610 MHz)

and the curves indicated by the thicker lines indicate operation in the high frequency mode (approximately 610 MHz-930 MHz).

Figure 12A:
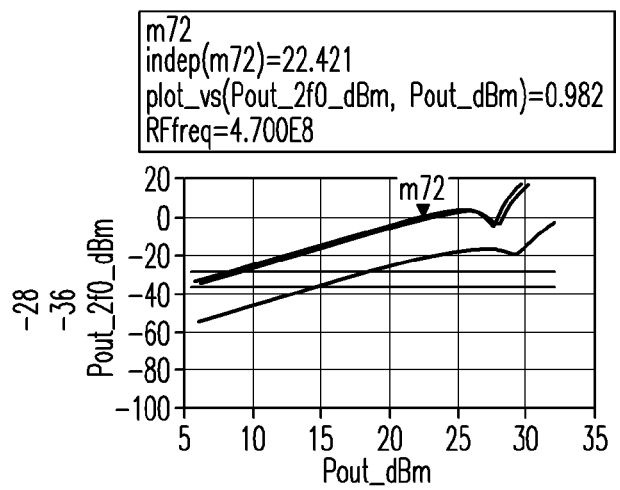
FIGS. 12A-12C are graphs showing the second-order harmonic rejection of RF signals amplified by embodiments of the broadband power amplifier described herein.
Figure 12B:
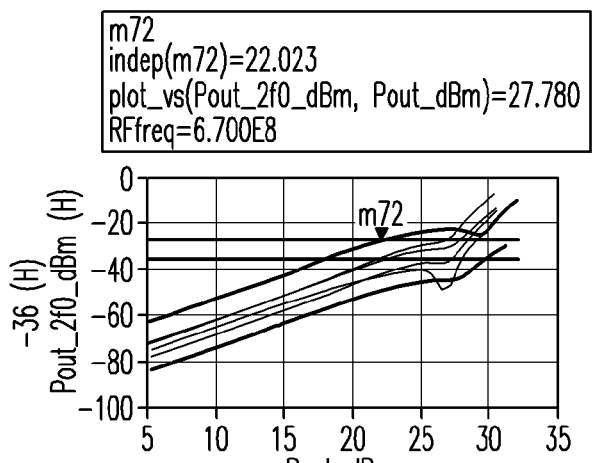
Figure 12C:
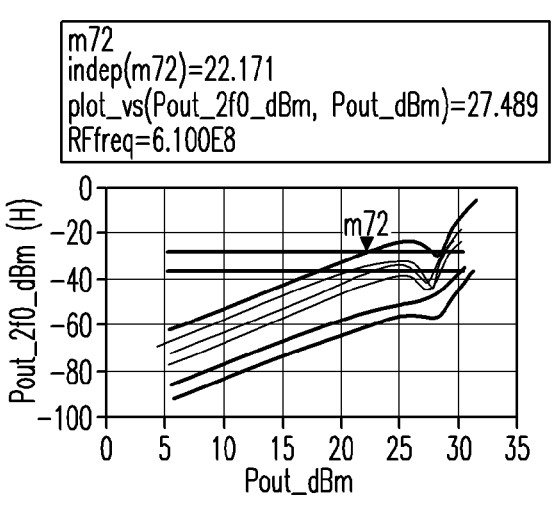

FIGS. 12A-12C are graphs showing the second-order harmonic rejection of RF signals amplified by embodiments of the broadband power amplifier described herein. FIG. 12A is a graph illustrating the second-order harmonic rejection of an approximately 470 MHz signal for the single broadband power amplifier of FIG. 3. FIG. 12B is a graph illustrating the second-order harmonic rejection of an approximately 670 MHz signal for the two amplifier embodiment of FIG. 4. FIG. 12C is a graph illustrating the second-order harmonic rejection of an approximately 610 MHz signal for the amplifier and switch embodiment of FIG. 5. In FIGS. 12B and 12C, the curves having thinner lines indicate the low frequency mode and the curves having thicker lines indicate high frequency mode.

Figure 13A:
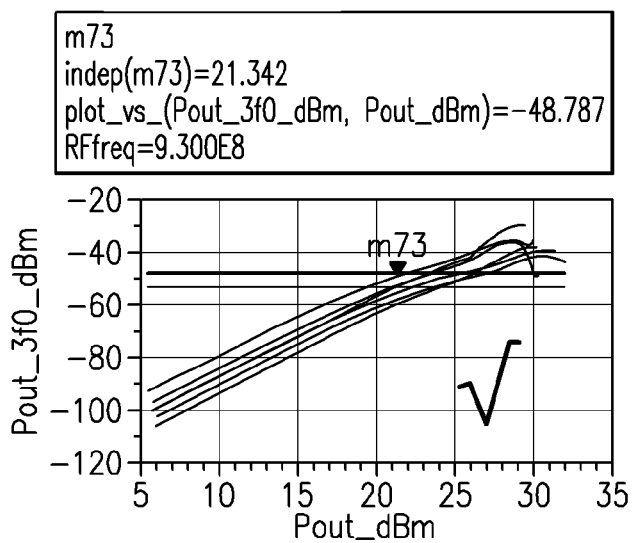
FIGS. 13A-13C are graphs showing the third-order harmonic rejection of RF signals amplified by embodiments of the broadband power amplifier described herein.
Figure 13B:
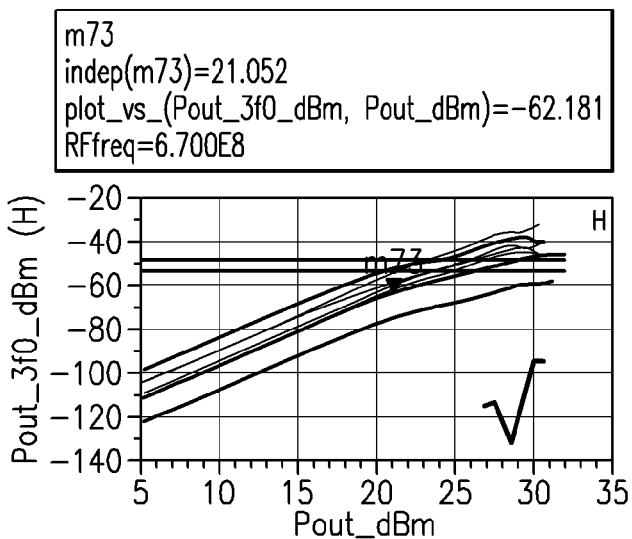
Figure 13C:
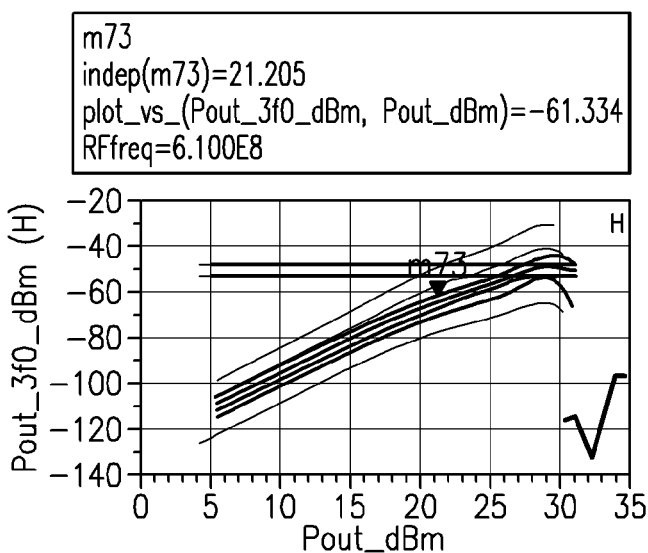

FIGS. 13A-13C are graphs showing the third-order harmonic rejection of RF signals amplified by embodiments of the broadband power amplifier described herein. FIG. 13A is a graph illustrating the third-order harmonic rejection of an approximately 930 MHz signal for the single broadband power amplifier of FIG. 3. FIG. 13B is a graph illustrating the third-order harmonic rejection of an approximately 670 MHz signal for the two amplifier embodiment of FIG. 4. FIG. 13C is a graph illustrating the third-order harmonic rejection of an approximately 610 MHz signal for the amplifier and switch embodiment of FIG. 5. In FIGS. 13B and 13C, the curves having thinner lines indicate the low frequency mode and the curves having thicker lines indicate high frequency mode.

Figure 14A:
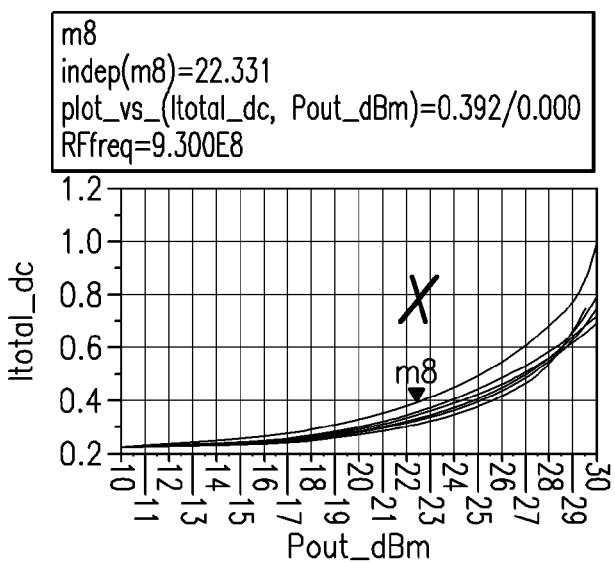
FIGS. 14A-14C are graphs showing the current dissipation performance of embodiments of the broadband power amplifier described herein.
Figure 14B:
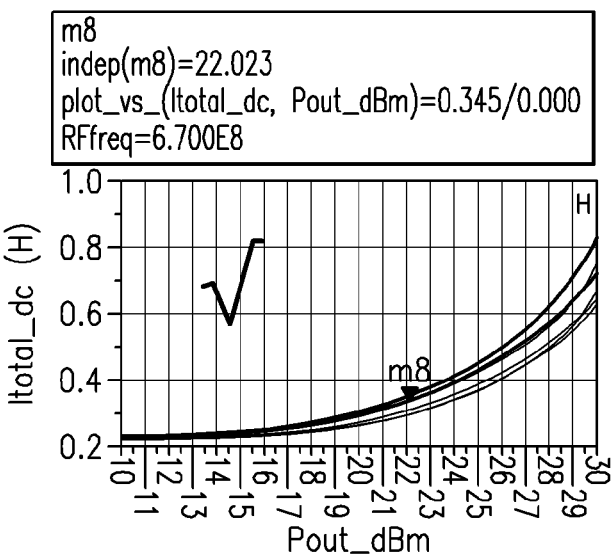
Figure 14C:
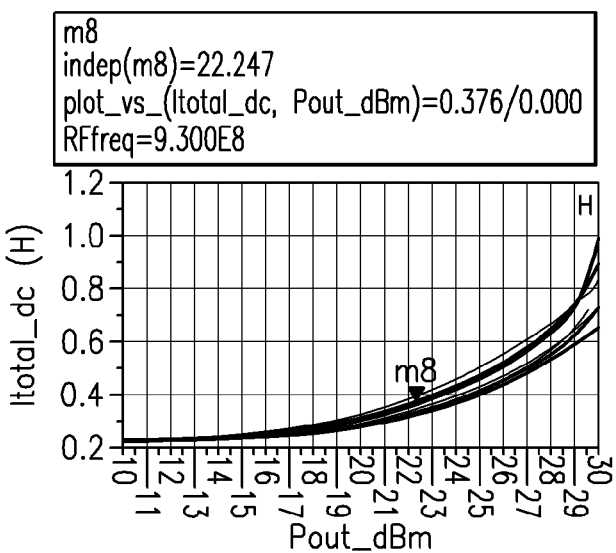

FIGS. 14A-14C are graphs showing the current dissipation performance of embodiments of the broadband power amplifier described herein. FIG. 14A is a graph illustrating the current dissipation for the single broadband power amplifier of FIG. 3. FIG. 14B is a graph illustrating the current dissipation for the two amplifier embodiment of FIG. 4. FIG. 14C is a graph illustrating the power dissipation for the amplifier and switch embodiment of FIG. 5. In FIGS. 14B and 14C, the curves having thinner lines indicate the low frequency mode and the curves having thicker lines indicate high frequency mode. The graphs show that the broadband power amplifier embodiment of FIG. 4 has the lowest power consumption, the embodiment of FIG. 3 consumes approximately 10% more current that the embodiment of FIG. 4, and the embodiment of FIG. 5 consumes approximately 7% more current that the embodiment of FIG. 4. This could be the result of the broadband operation and high $P_{SAT}$ requirements. Some options to reduce the current consumption include using lower bias currents and smaller second stage transistors.

FIGS. 3, 4 and 5-9 describe embodiments of broadband power amplifiers, which have different implementations and differing performance characteristics. The embodiment of FIG. 3 can be implemented on a single integrated circuit. The embodiment of FIG. 4 can be implemented as two integrated circuits, where one amplifier IC operates in the low frequency mode and the other amplifier IC operates in the high frequency mode. The embodiment of FIG. 5 can be implemented as a single integrated circuit and a SOI switch where the amplifier IC operates in the high frequency mode and the SOI switch operates in the low frequency mode.

Example Applications

Figure 15:
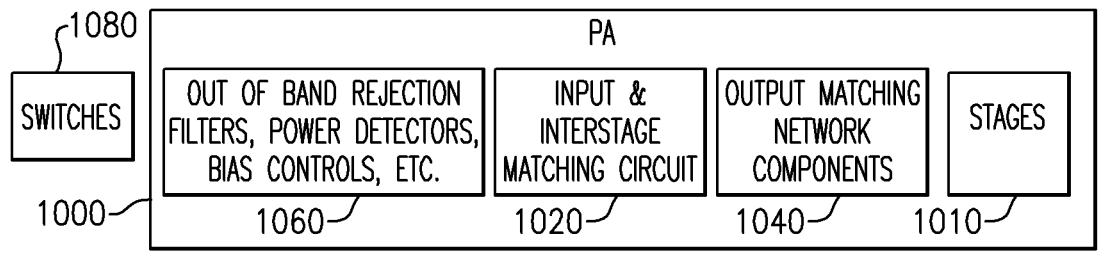
FIG. 15 is a schematic block diagram illustrating that one or more features associated with the present disclosure can be implemented as a broadband power amplifier and as one or more switches, according to certain embodiments.

FIG. 15 schematically shows that one or more features associated with the present disclosure can be implemented as a broadband power amplifier 1000 and one or more switches 1080. The power amplifier 1000 can include one or more amplifying stages 1010, input and interstage matching circuits 1020, and output matching network components 1040 associated with the switches 1080. The power amplifier 1000 can also include components such as out of band rejection filters, power detectors, and bias controls (collectively indicated as 1060).

Figure 16:
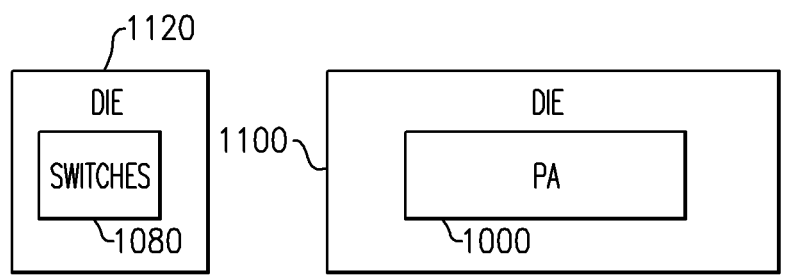
FIG. 16 is a schematic block diagram illustrating that a power amplifier and switches as described in reference to FIG. 15 can be implemented on semiconductor die, according to certain embodiments.

FIG. 16 shows that in some embodiments, a power amplifier 1000 as described in reference to FIG. 15 can be implemented on a semiconductor die 1100. Although the description herein of the power amplifier 1000 is in the context a single die, it will be understood that various parts of the power amplifier 1000 can also be implemented in separate dies. FIG. 16 also shows that in some embodiments, switches 1080 as described in reference to FIG. 15 can be implemented on a semiconductor die 1120. In other embodiments, the switches 1080 and the power amplifier 1000 are implemented on the same semiconductor die.

Figure 17:
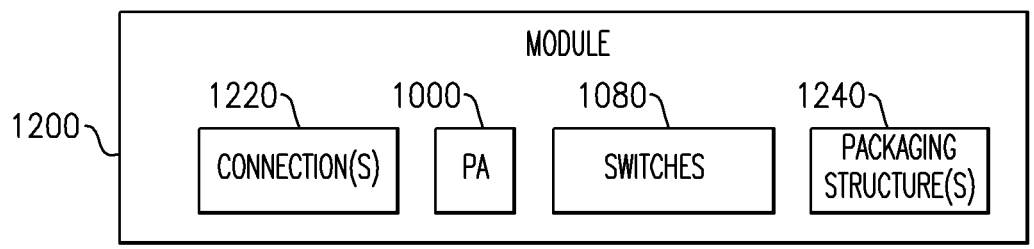
FIG. 17 is a schematic block diagram illustrating that a power amplifier and switches as described in reference to FIG. 15 can be implemented in a packaged module, according to certain embodiments.

FIG. 17 shows that in some embodiments, a power amplifier 1000 having one or more features as described herein can be implemented in a packaged module 1200. As described herein, the power amplifier 1000 can be implemented in one or more dies; and such die(s) can be packaged in the module 1200. The module 1200 can further include one or more packaging structures 1240 that can provide, for example, protection for the power amplifier 1000. The module 1200 can further include connection features 1220 configured to provide electrical connections to and from the power amplifier 1000.

FIG. 17 shows that in some embodiments, the switches 1080 having one or more features as described herein can be implemented in the packaged module 1200. As described herein, the switches 1080 can be implemented in one or more dies; and such die(s) can be packaged in the module 1200.

Figure 18:
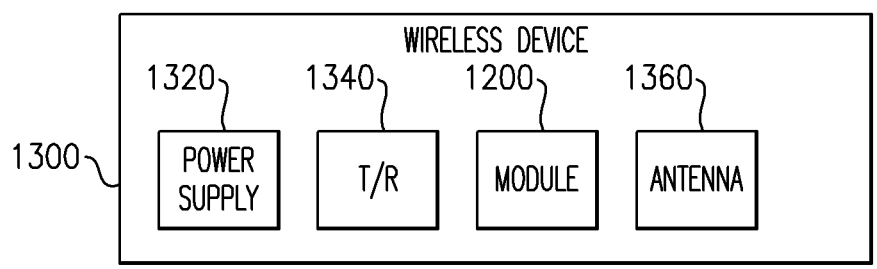
FIG. 18 shows that in some embodiments, a component such as the module FIG. 17 can be included in a wireless device, according to certain embodiments.

FIG. 18 shows that in some embodiments, a component such as the module 1200 of FIG. 17 can be included in a wireless device 1300. In some embodiments, the device 1300 can include wireless local area network (WLAN) functionality. Although described in the context of WLAN applications, one or more features described herein can also be implemented in other wireless applications.

In FIG. 18, the wireless device 1300 is depicted as including other components such an antenna 1360 and a transceiver module 1340. The wireless device 1300 can also be configured to receive or be electrically connected to a power supply 1320.

Figure 19:
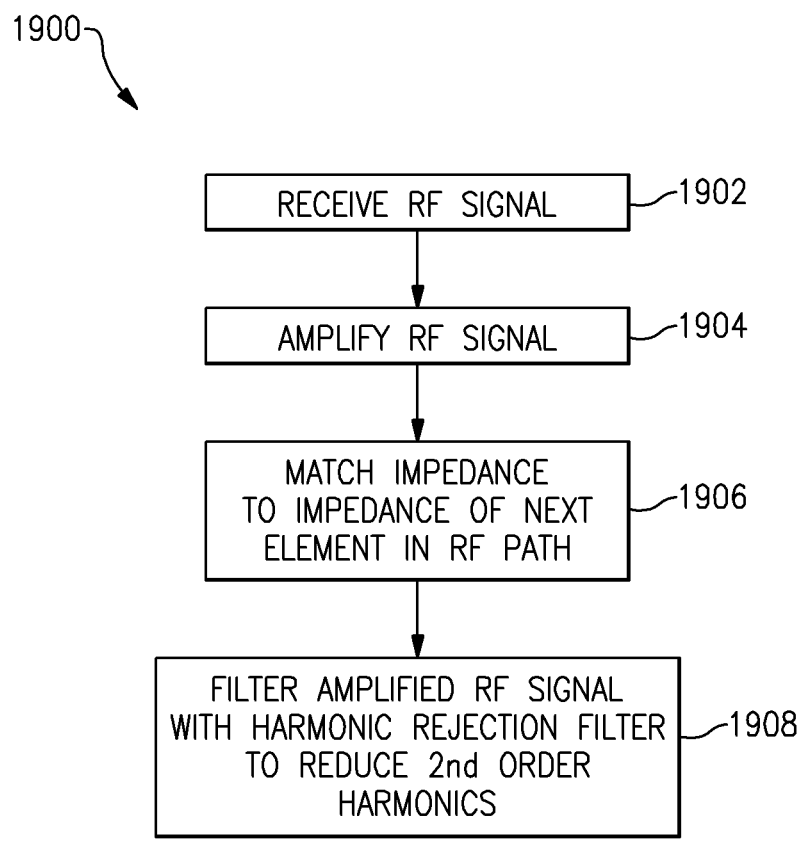
FIG. 19 illustrates a process to reduce harmonics in a radio frequency signal, according to certain embodiments.

FIG. 19 illustrates an exemplary process 1900 to reduce harmonics in a radio frequency output signal. Beginning at step 1902, the process 1900 receives along a radio frequency path at an input to a power amplifier circuit a radio frequency signal having a fundamental frequency in a band of operating frequencies. At step 1904, the process 1900 amplifies the radio frequency signal to provide an amplified radio frequency signal.

At step 1906, the process 1900 matches an impedance of the power amplifier to an impedance of a next element in the radio frequency path. At step 1908, the process 1900 filters the amplified radio frequency signal with a harmonic rejection filter to reduce second-order harmonic frequencies when the power amplifier is operating in a low frequency band.

In an embodiment, the harmonic rejection filter includes a switched harmonic trap, a first switched capacitor element, and a second switched capacitor element. In another embodiment, the process 1900 closes switches in the harmonic rejection filter when the power amplifier is operating in the low frequency band.

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
an amplifier circuit configured to receive a radio frequency signal and provide an amplified radio frequency signal over a frequency band of operation; and
a tunable output matching network electrically connected to the amplifier circuit to receive the amplified radio frequency signal, the tunable output matching network including first and second passive components configured in series with each other and with a first switch, a third passive component configured in series with a second switch, and a fourth passive component configured in series with a third switch, the first, second, and third switches configured to operate to provide second-order harmonic rejection for the amplified radio frequency signal when the amplifier circuit operates in a low frequency band, the first, second, third, and fourth passive components selected from the group consisting of inductors and capacitors.

2. The power amplifier of claim 1 wherein the frequency band of operation includes the low frequency band of between approximately 470 MHz to approximately 610 MHz and a high frequency band of between approximately 610 MHz to approximately 930 MHz.

3. The power amplifier of claim 1 wherein the power amplifier includes a broadband power amplifier.

4. The power amplifier of claim 1 further comprising an interstage matching circuit.

5. The power amplifier of claim 4 further comprising an inductor, wherein an output of the interstage matching circuit couples to ground through the inductor.

6. The power amplifier of claim 1 wherein values of the inductors and capacitors are selected to trap second-order harmonics of the amplified radio frequency signal.

7. The power amplifier of claim 1 further comprising a third-order inductance-matching circuit that includes the fourth passive component configured in series with the third switch.

8. The power amplifier of claim 1 wherein the amplifier circuit, and the first, second, third, and the fourth passive components are implemented on a silicon germanium die, and the first, second, and third switches are implemented on a silicon on insulator die.

9. The power amplifier of claim 1 wherein the first and second passive components and the first switch form a switched harmonic trap that is configured to create a short circuit to ground for specific harmonic frequencies of the amplified radio frequency signal.

10. The power amplifier of claim 9 wherein signal energy from the specific harmonic frequencies is reflected back to the amplifier circuit for partial recycling.

11. A wireless mobile device comprising the power amplifier of claim 1.

12. A power amplifier module comprising:
an input pin configured to receive a radio frequency input signal;
an output pin configured to provide an amplified radio frequency signal;
a power amplifier die including an amplifier circuit, an input pad electrically connected to the input pin, and an output pad electrically connected to the output pin, the power amplifier die further including a series inductor and a first capacitor configured in series with a first switch, a second capacitor configured in series with a second switch, and a third capacitor configured in series with a third switch;
a switch die including the first, second, and third switches; and
a plurality of interconnections configured to electrically connect the series inductor and the first capacitor with the first switch to provide a first harmonic trap, electrically connect the second capacitor to the second switch to provide a second harmonic trap, and to electrically connect the third capacitor to the third switch to provide a third harmonic trap, the first, second, and third switches configured to be in an ON position when the amplifier circuit operates in a low frequency band to reduce second-order harmonics in the amplified radio frequency signal.

13. The power amplifier module of claim 12 wherein values of the series inductor, the first capacitor, the second capacitor and the third capacitor are selected to reduce the second-order harmonic frequencies when operating in a low frequency mode.

14. The power amplifier module of claim 13 wherein a frequency range of operation is between approximately 470 MHz to approximately 930 MHz and includes the low frequency band of between approximately 470 MHz to approximately 610 MHz, and a high frequency band of between approximately 610 MHz to approximately 930 MHz.

15. The power amplifier module of claim 12 wherein the power amplifier die includes a silicon germanium die, and the switch die includes a silicon on insulator die.

16. A wireless mobile device comprising the power amplifier module of claim 12.

17. A method to reduce harmonics in a radio frequency output signal, the method comprising:
receiving along a radio frequency path at an input to a power amplifier circuit a radio frequency signal having a fundamental frequency in a band of operating frequencies;
amplifying the radio frequency signal to provide an amplified radio frequency signal;
matching an impedance of the power amplifier circuit to an impedance of a next element in the radio frequency path;
filtering the amplified radio frequency signal with a harmonic rejection filter to reduce second-order harmonic frequencies when the power amplifier is operating in a low frequency band, the harmonic rejection filter including first and second passive components configured in series with each other and with a first switch to form a switched harmonic trap and a third passive component configured in series with a second switch to form a first switched capacitor element; and
enhancing the bandwidth of the harmonic rejection filter with a third-order inductance-matching circuit that includes a fourth passive component configured in series with a third switch to form a second switched capacitor element, the first, second, third, and fourth passive components selected from the group consisting of inductors and capacitors.

18. The method of claim 17 wherein the band of operating frequencies is between approximately 470 MHz to approximately 930 MHz and the low frequency band is between approximately 470 MHz to approximately 610 MHz.

19. The method of claim 17 wherein the power amplifier circuit, and the first, second, third, and fourth passive components are implemented on a first semiconductor die, and wherein the first, second, and third switches are implemented on a second semiconductor die.

20. The method of claim 17 wherein the first semiconductor die is a silicon germanium die, and the second semiconductor die is a silicon on insulator die.

* * * * *